(12) United States Patent
Chien et al.

(10) Patent No.: US 12,532,542 B2
(45) Date of Patent: Jan. 20, 2026

(54) DISPLAY PANEL AND DISPLAY DEVICE

(71) Applicant: AUO Corporation, Hsin-Chu (TW)

(72) Inventors: I-Peng Chien, Hsin-Chu (TW); Tai-Tso Lin, Hsin-Chu (TW); Wen-Yung Wei, Hsin-Chu (TW); Chen-Yuan Tu, Hsin-Chu (TW)

(73) Assignee: AUO Corporation, Hsin-Chu (TW)

( * ) Notice: Subject to any disclaimer, the term of this patent is extended or adjusted under 35 U.S.C. 154(b) by 450 days.

(21) Appl. No.: 18/172,592

(22) Filed: Feb. 22, 2023

(65) Prior Publication Data
US 2023/0275100 A1    Aug. 31, 2023

Related U.S. Application Data

(60) Provisional application No. 63/313,744, filed on Feb. 25, 2022.

(30) Foreign Application Priority Data

Jul. 8, 2022   (TW) .................................. 111125762

(51) Int. Cl.
*H10D 86/60*    (2025.01)
*H10D 86/40*    (2025.01)

(52) U.S. Cl.
CPC ........... *H10D 86/60* (2025.01); *H10D 86/441* (2025.01)

(58) Field of Classification Search
CPC ..................... H10D 86/441; H10D 86/443
See application file for complete search history.

(56) References Cited

U.S. PATENT DOCUMENTS

| 2019/0172890 A1* | 6/2019 | Cho ................... H10K 59/8722 |
| 2023/0165110 A1* | 5/2023 | Yu .................... H10K 59/80521 |
| | | 257/72 |

FOREIGN PATENT DOCUMENTS

| CN | 206148473 U | 5/2017 |
| CN | 108899326 A | 11/2018 |
| CN | 109119329 A | 1/2019 |
| CN | 114141810 A | 3/2022 |

* cited by examiner

*Primary Examiner* — Thanh Y. Tran
(74) *Attorney, Agent, or Firm* — WPAT, PC

(57) ABSTRACT

This disclosure provides a display panel including pixels and a metal layer below the pixels. The metal layer includes a body portion at the center of the display panel and a mesh portion at the edge of the display panel and adjacent to the body portion. The contour of the body portion defines a first region, where first pixels are disposed in the first region and electrically connected to the body portion. The contour of the mesh portion defines a second region, where second pixels are disposed in the second region and electrically connected to the mesh portion. The mesh portion and the body portion are electrically connected to each other, the density of metal distribution of the first region is higher than that of the second region, and the area of the second region is 20% to 40% of the area of the display panel.

20 Claims, 6 Drawing Sheets

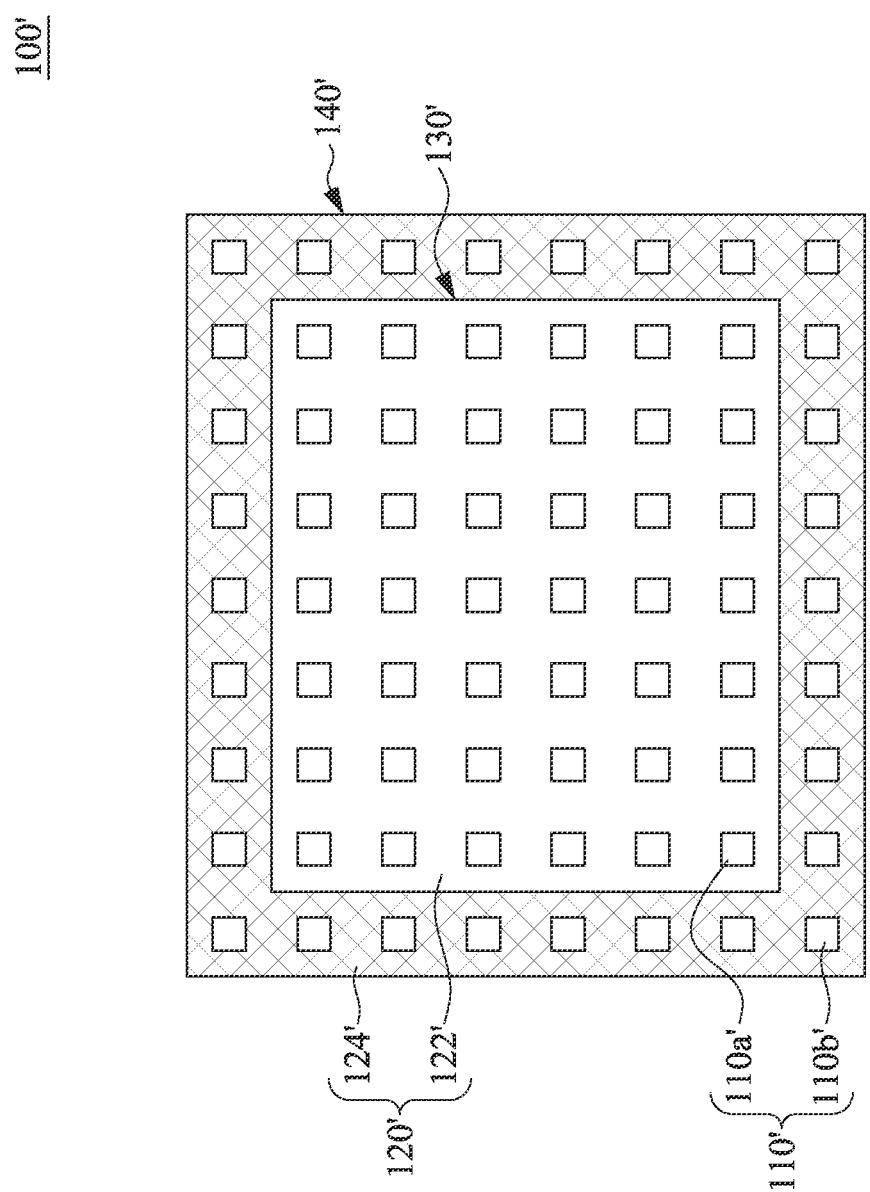

DISPLAY PANEL AND DISPLAY DEVICE

CROSS-REFERENCE TO RELATED APPLICATION

This application claims priority to U.S. Provisional Application Ser. No. 63/313,744 filed Feb. 25, 2022, and Taiwan Application Serial Number 111125762, filed Jul. 8, 2022, the disclosures of which are incorporated herein by reference in their entireties.

BACKGROUND

Field of Invention

The present disclosure relates to the display panel of the display device. More particularly, the present disclosure relates to the display panel having the metal electrode layer in the multilayer structure.

Description of Related Art

Splicing the display panels in one display device to form the display region provides the image with higher precision and easier maintenance of the display device. The metal electrode layers in the multilayer structures of different display panels are electrically connected to each other such that the electric signal can be simultaneously provided to the multiple display panels. However, the uneven stress caused by the metal electrode layer in the multilayer structure may lead to the warpage of the display panel, which increases the difficulty of precisely splicing the display panels and impacts the imaging functionality of the display device. Therefore, this problem of the display panel needs to be solved to improve the imaging performance of the display device.

SUMMARY

According to one embodiment of the present disclosure, a display panel includes pixels and a first metal layer below the pixels. The first metal layer includes a first body portion at a center of the display panel and a first mesh portion at an edge of the display panel and adjacent to the first body portion. A contour of the first body portion defines a first region of the display panel. First pixels of the pixels are disposed in the first region and electrically connected to the first body portion. A contour of the first mesh portion defines a second region of the display panel. Second pixels of the pixels are disposed in the second region and electrically connected to the first mesh portion. The first mesh portion and the first body portion are electrically connected to each other. A first density of metal distribution of the first region is higher than a second density of metal distribution of the second region. An area of the second region is 20% to 40% of an area of the display panel.

In some embodiments, the first density of metal distribution of the first region is higher than 85%.

In some embodiments, the second density of metal distribution of the second region is in a range of 50% to 85%.

In some embodiments, a total density of metal distribution of the first metal layer is higher than or equal to 50%.

In some embodiments, an area of the first region is 60% to 80% of the area of the display panel.

In some embodiments, an electric potential of the first region is same as that of the second region.

In some embodiments, the first body portion directly contacts the first mesh portion.

In some embodiments, the first body portion and the first mesh portion are integrally formed into one piece.

In some embodiments, a linewidth of the first mesh portion is in a range of 2 μm to 30 μm.

In some embodiments, a line spacing of the first mesh portion is smaller than or equal to half of a distance between two of the pixels.

In some embodiments, a line spacing of the first mesh portion is in a range of 3 μm to 250 μm.

In some embodiments, the first mesh portion has a linear shape, a diamond shape, a square shape, or a honeycomb shape.

In some embodiments, the first mesh portion has a combination of different shapes distributed in different portions of the first mesh portion.

In some embodiments, the display panel further includes a second metal layer below the first metal layer. The second metal layer includes a second body portion at the center of the display panel and a second mesh portion at the edge of the display panel and adjacent to the second body portion. A contour of the second body portion defines a third region of the display panel, and a contour of the second mesh portion defines a fourth region of the display panel. A third density of metal distribution of the third region is higher than a fourth density of metal distribution of the fourth region.

In some embodiments, an orthogonal projection of the first mesh portion onto the second metal layer is at least partially overlapped with the second mesh portion.

In some embodiments, an area ratio of the first region to the second region is equal to an area ratio of the third region to the fourth region.

In some embodiments, an area of the fourth region is different from that of the second region.

According to another embodiment of the present disclosure, a display device includes a plurality of display panels in a display region. Each of the plurality of display panels includes a thin film transistor, an electrode layer above and electrically connected to the thin film transistor, and a pad layer above and electrically connected to the electrode layer. A body portion of the electrode layer is at a center of the display panel. A mesh portion of the electrode layer is at an edge of the display panel and adjacent to the body portion. A contour of the body portion defines a first region of the display panel. A contour of the mesh portion defines a second region of the display panel. A partial area of the first region occupied by the body portion is larger than a partial area of the second region occupied by the mesh portion. An area of the second region is 20% to 40% of an area of the display panel. The plurality of display panels are spliced together by the mesh portion of each of the plurality of display panels to form the display region.

In some embodiments, the mesh portion of one of the display panels is distributed at two opposite sides of the display panel.

In some embodiments, the display device further includes a peripheral circuit in a peripheral circuit region adjacent to the display region, in which the peripheral circuit is electrically connected to the display panels by the mesh portion of one of the display panels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a top view of a display panel according to another embodiment of the present disclosure.

DETAILED DESCRIPTION

Figure 1:
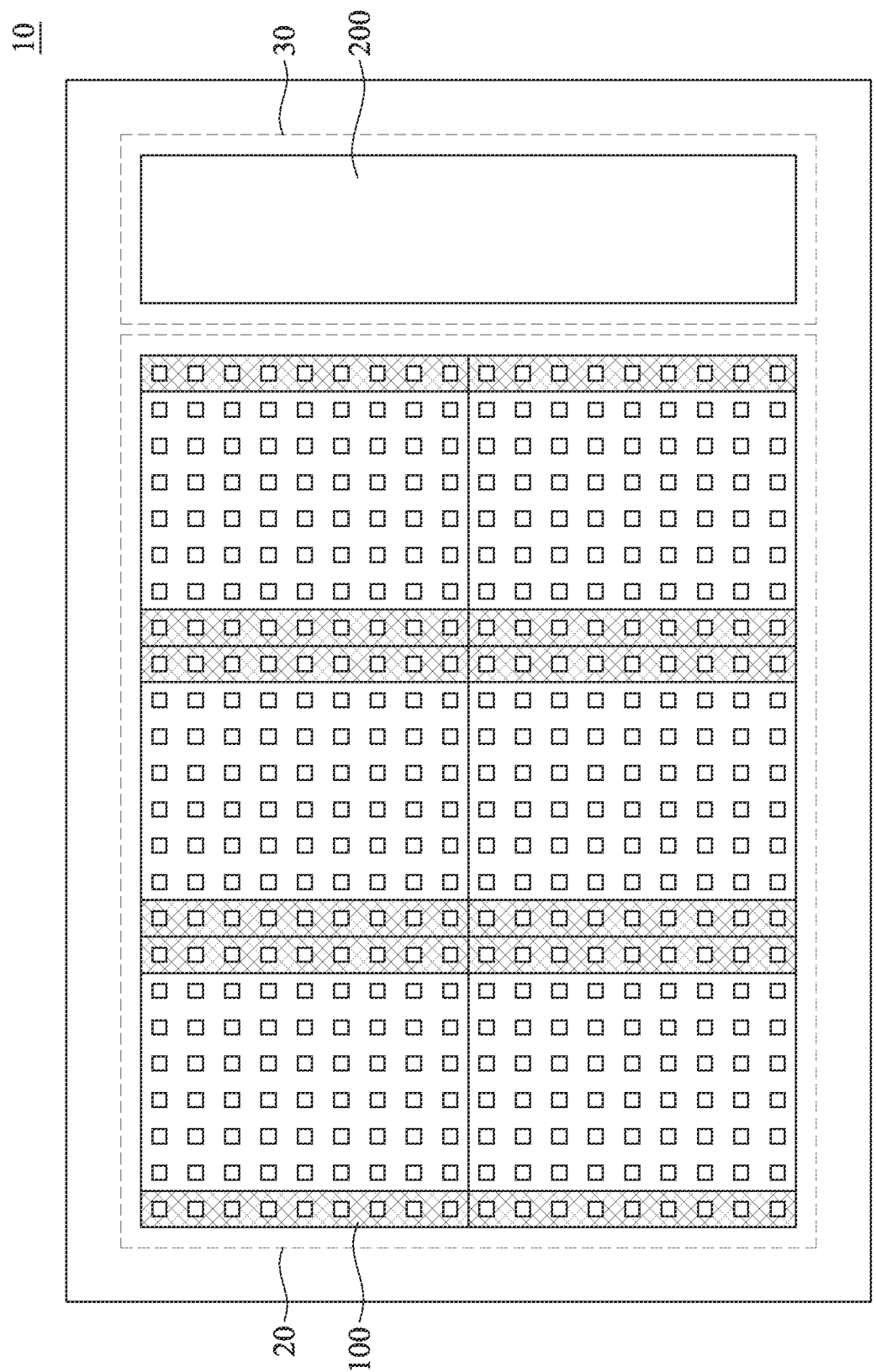
FIG. 1 illustrates a top view of a display device according to one embodiment of the present disclosure.

The following disclosure provides many different embodiments, or examples, for implementing different features of the provided subject matter. Specific examples of components, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that although the terms "first", "second", "third", etc., can be used to describe various elements, components, regions, layers and/or parts in this specification, these elements, components, regions, layers and/or parts should not be limited by these terms. These terms are used only to distinguish one element, component, region, layer, or part from another element, component, region, layer, or part. Therefore, the first element, component, region, layer, or part discussed below may be referred to as a second element, component, region, layer, or part without departing from the instructions of the specification.

The present disclosure provides a display panel including pixels and a metal layer below the pixels, in which the metal layer includes a body portion at the center of the display panel and a mesh portion at the edge of the display panel. The contour of the body portion defines a first region of the display panel, while the contour of the mesh portion defines a second region of the display panel. The density of metal distribution of the first region is higher than that of the second region, and the area of the second region is 20% to 40% of the area of the display panel. As a result, the mesh portion may effectively reduce the warpage possibility at the edge of the display panel, and the body portion may maintain the low impedance of the metal layer. Therefore, the metal layer with suitable ratio of the body portion and the mesh portion improves the imaging performance of the display panel.

According to some embodiments of the present disclosure, FIG. 1 illustrates a top view of a display device 10. The display device 10 includes a display region 20 and a peripheral circuit region 30 adjacent to the display region 20. The display region 20 includes a plurality of display panels 100 spliced together to collectively display the image. A peripheral circuit 200 in the peripheral circuit region 30 is electrically connected to the display panel 100 to provide the electric signals for the imaging function of the display panel 100.

Figure 2:
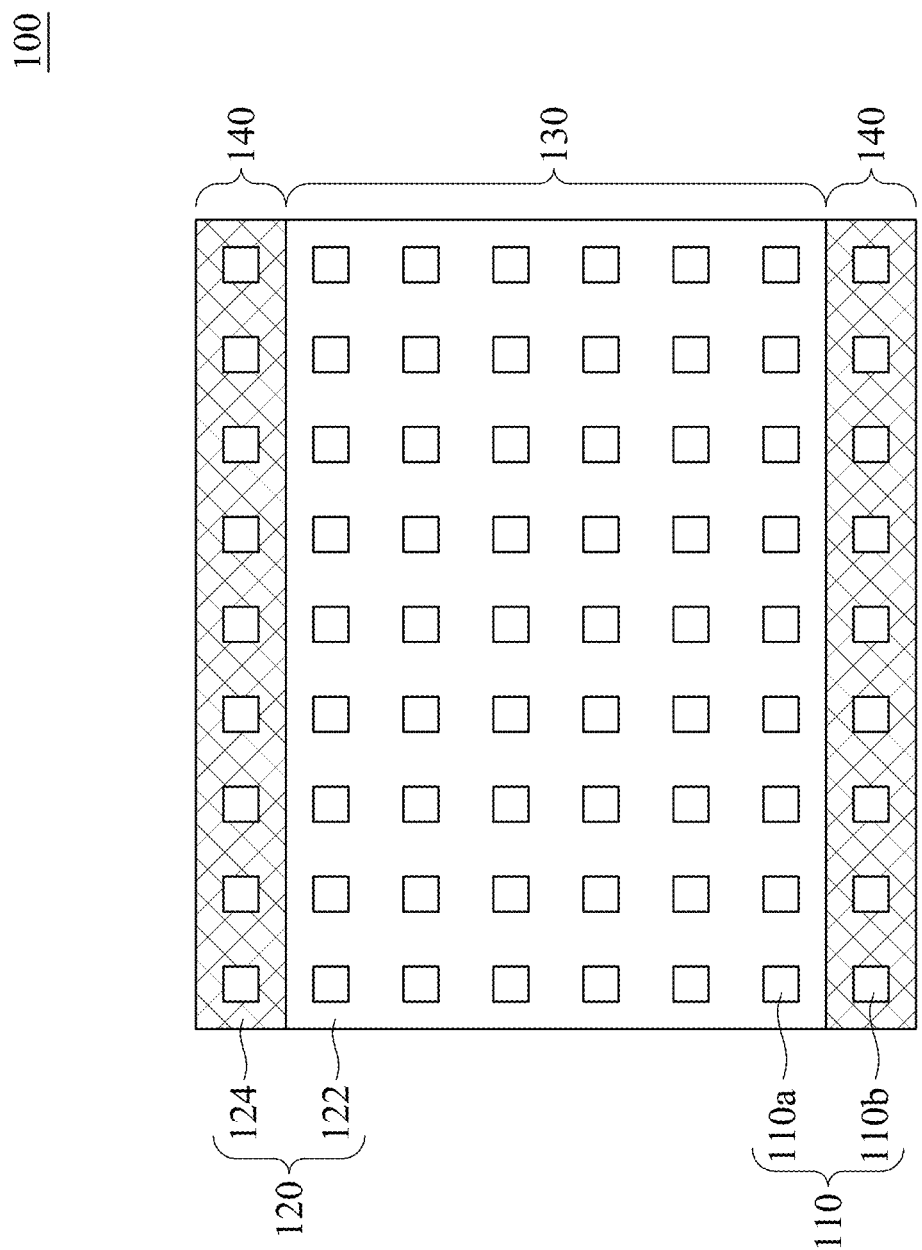
FIG. 2 illustrates a top view of a display panel according to one embodiment of the present disclosure.

FIG. 2 illustrates a top view of one of the display panels 100 in FIG. 1. The display panel 100 includes a plurality of pixels 110 and a metal layer 120 below the pixels 110. The metal layer 120 may act as an electrode layer to transmit the electric signal from the peripheral circuit 200 in FIG. 1 to the pixels 110. To clearly illustrate the relative arrangement of the pixels 110 and the metal layer 120, additional components may be omitted in the display panel 100 of FIG. 2, such as the pad layer, the interlayer insulator or the like between the pixels 110 and the metal layer 120.

Referring to FIG. 2, the metal layer 120 includes a body portion 122 at the center of the display panel 100 and a mesh portion 124 at the edge of the display panel 100, in which the mesh portion 124 is adjacent to the body portion 122. Specifically, the body portion 122 and the mesh portion 124 are metal materials electrically connected to each other to collectively form the metal layer 120. The body portion 122 and the mesh portion 124 undergo different patterning process such that the body portion 122 and the mesh portion 124 have different metal patterns. The mesh portion 124 and the body portion 122 in FIG. 2 are respectively illustrated as a hollow metal pattern and a sheet metal pattern for simplicity purpose, however, those skilled in the art should appreciate that the body portion 122 may be patterned corresponding to the design of the display panel 100.

More specifically, the metal in the body portion 122 and the metal in the mesh portion 124 are distributed over different areas, so that a density of metal distribution caused by the body portion 122 is higher than a density of metal distribution caused by the mesh portion 124. As shown in FIG. 2, the contour of the body portion 122 defines a first region 130 of the display panel 100. A plurality of first pixels 110a of the pixels 110 are disposed in the first region 130 and electrically connected to the body portion 122. Correspondingly, the contour of the mesh portion 124 defines a second region 140 of the display panel 100. A plurality of second pixels 110b of the pixels 110 are disposed in the second region 140 and electrically connected to the mesh portion 124.

As used herein, the term "density of metal distribution" is the ratio of a distributed area of the metal in the metal layer to an area of the display panel, or the ratio of a distributed area of the metal in the body portion (mesh portion) to a partial area of the display panel defined by the contour of the body portion (mesh portion). For example, the first density of metal distribution of the first region 130 is the ratio of the distributed area of the metal of the body portion 122 to the area of the first region 130. The second density of metal distribution of the second region 140 is the ratio of the distributed area of the metal of the mesh portion 124 to the area of the second region 140.

As mentioned above, the first density of metal distribution of the first region 130 is higher than the second density of metal distribution of the second region 140. As a result, the stress applied by the metal layer 120 to the substrate below, such as the substrate 150 in FIG. 3A, would not concentrate in the second region 140, and the stress received by the substrate portion below the second region 140 may be comparable to the substrate portion below the first region 130. Since the body portion 122 is at the center of the display panel 100 while the mesh portion 124 is at the edge of the display panel 100, the mesh portion 124 may prevent the stress from concentrating at the edge of the display panel 100. This reduces the warpage possibility at the edge of the display panel 100 and increases the yield of the display panel 100.

The first region 130 has higher density of metal distribution such that the metal layer 120 may have the low impedance suitable for the display panel 100. On the other hand, the second region 140 has lower density of metal distribution such that the metal layer 120 may not cause the warpage of the display panel 100. In some embodiments, the first region 130 and the second region 140 may respectively have the density of metal distribution in a suitable range, thereby reducing the warpage possibility at the edge of the display panel 100 and maintaining the sufficiently low impedance of the metal layer 120. For example, the first density of metal distribution of the first region 130 may be higher than 85%, so that the low impedance of the first region 130 may not impact the imaging function of the display panel 100. The second density of metal distribution of the second region 140 may be lower than 85%, so that the second region 140 may significantly reduce the warpage possibility of the display panel 100. In some embodiments, the first density of metal distribution of the first region 130 may be in a range of 85% to 95%, while the second density of metal distribution of the second region 140 may be in a range of 50% to 85%.

It should be noted that the metal layer 120 formed by the body portion 122 and the mesh portion 124 may have a total density of metal distribution (i.e., the ratio of the distributed area of the metal in the metal layer 120 to the total area of the display panel 100) higher than or equal to 50%, so that the impedance of the whole metal layer 120 is low enough to promote the transmission of the electric signal. Furthermore, the difference between the density of metal distribution of the first region 130 and that of the second region 140 may not change the same electric potential in two regions of the metal layer 120, so the first pixels 110a in the first region 130 and the second pixels 110b in the second region 140 may work together for imaging.

To reduce the warpage possibility of the display panel 100 and maintain the low impedance of the metal layer 120, the first region 130 and the second region 140 are disposed on the display panel 100 with a suitable ratio. Specifically, the area of the second region 140 is 20% to 40% of the area of the display panel 100. If the area of the second region 140 is smaller than 20% of the area of the display panel 100, the mesh portion 124 may be too small to effectively reduce the warpage possibility of the display panel 100. If the area of the second region 140 is larger than 40% of the area of the display panel 100, the mesh portion 124 may significantly increase the impedance of the metal layer 120, which impacts the performance of the display panel 100.

In some embodiments, the area of the first region 130 may be 60% to 80% of the area of the display panel 100. If the area of the first region 130 is smaller than 60% of the area of the display panel 100, the body portion 122 may be too small to effectively lower the impedance of the metal layer 120, thereby increasing the impedance of the whole metal layer 120 and impacting the display panel 100. If the area of the first region 130 is larger than 80% of the area of the display panel 100, the body portion 122 may lead to the uneven stress applied by the metal layer 120 to the substrate, which increases the warpage possibility of the display panel 100.

Figure 3A:
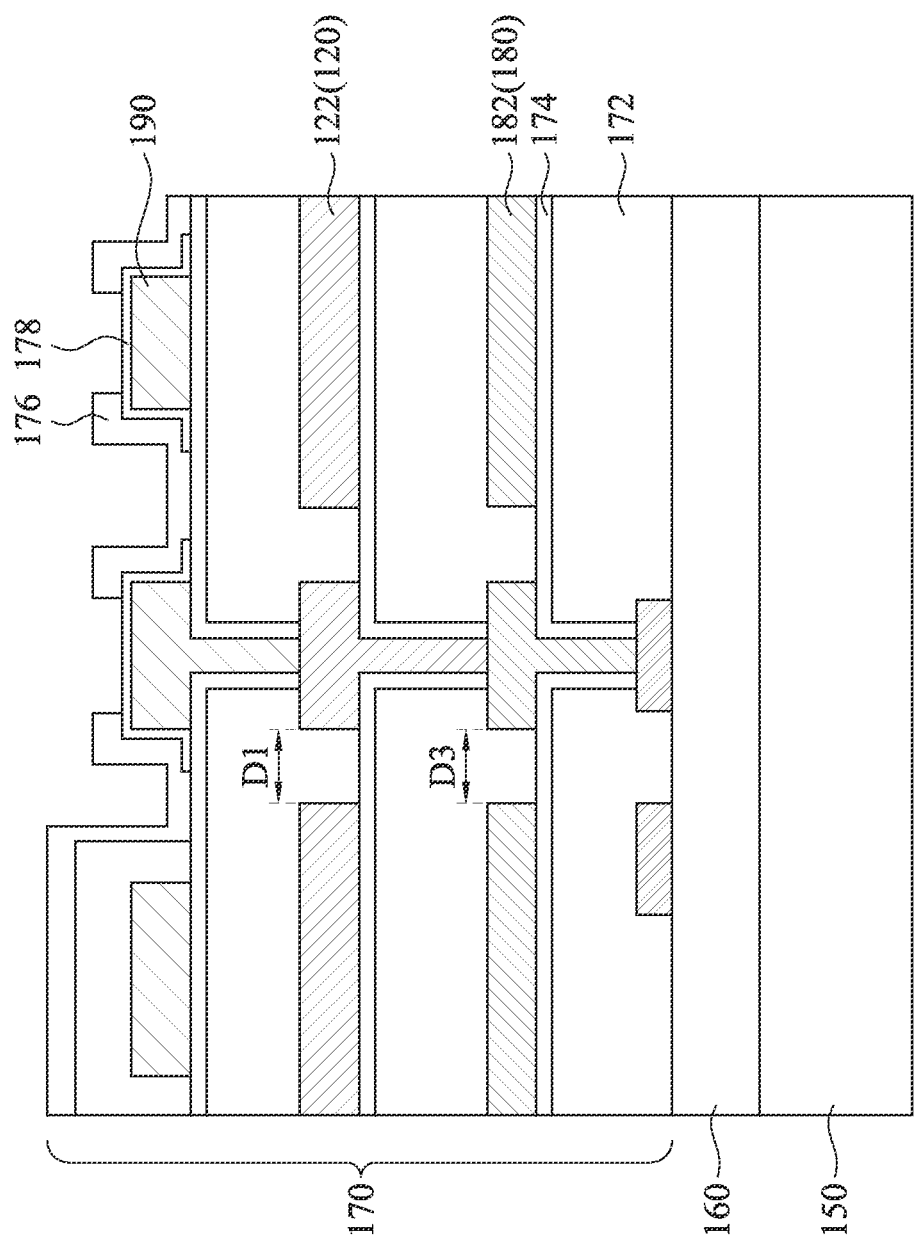
FIG. 3A and FIG. 3B illustrate cross-sectional views of a display panel according to one embodiment of the present disclosure.
Figure 3B:
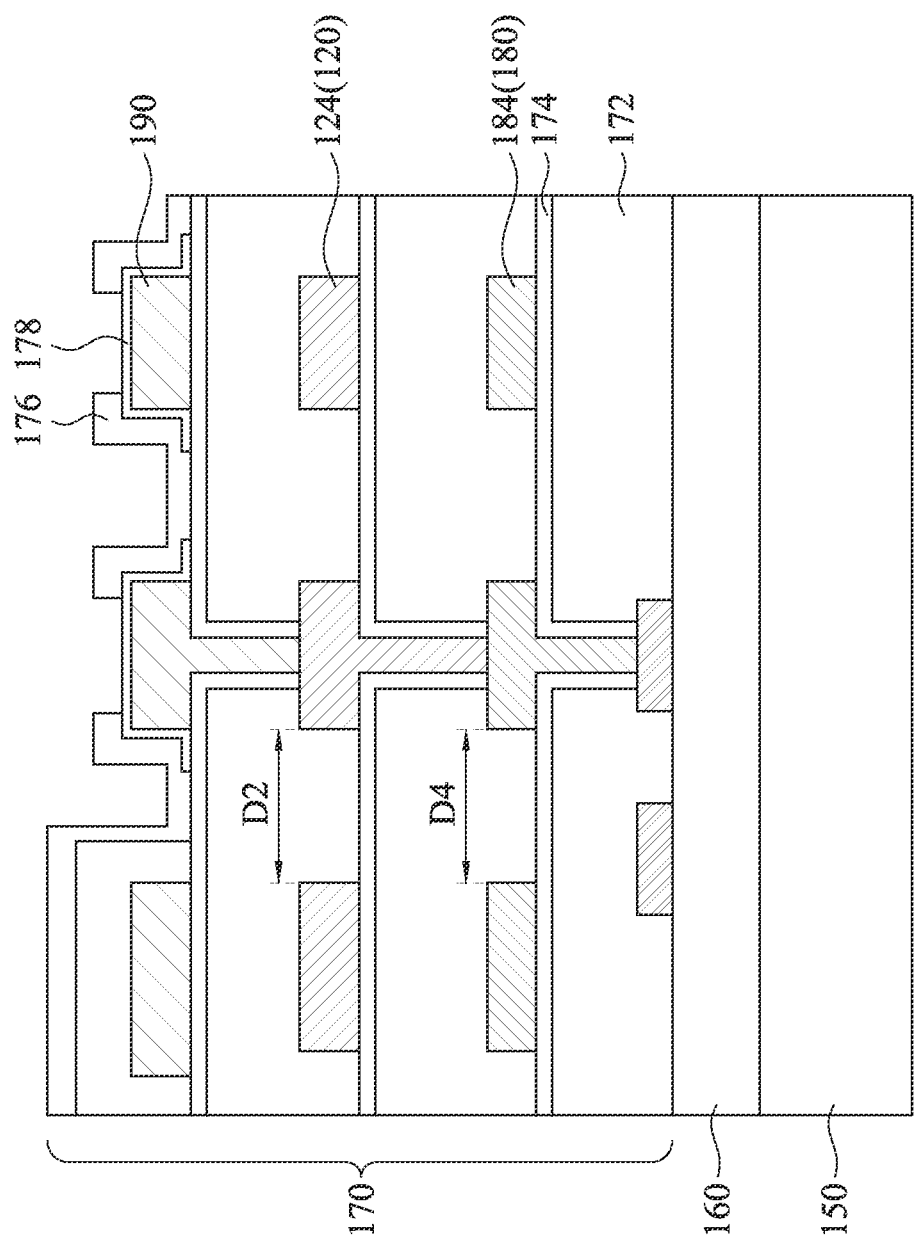

According to some embodiments of the present disclosure, FIG. 3A and FIG. 3B illustrate cross-sectional views of the display panel 100 to show the different density of metal distribution in different regions in more detail. Specifically, FIG. 3A illustrates the cross-sectional view of the first region 130 of the display panel 100, FIG. 3B illustrates the cross-sectional view of the second region 140 of the display panel 100, and the first density of metal distribution of the first region 130 is higher than the second density of metal distribution of the second region 140.

Referring to FIG. 3A and FIG. 3B, the first region 130 and the second region 140 include a substrate 150, a thin film transistor (TFT) 160 above the substrate 150, and a multilayer structure 170 above the thin film transistor 160. The multilayer structure 170 includes flat layers 172, interlayer insulators 174, electrode layers including the body portion 122 and the mesh portion 124 of the metal layer 120, and a pad layer 190. To clearly illustrate the above-mentioned components in the regions, additional components may be omitted in FIG. 3A and FIG. 3B, such as the pixels disposed on the multilayer structure 170 and electrically connected to the metal layer 120.

The substrate 150 may be a carrier substrate made of the material including glass or flexible materials. The thin film transistor 160 is electrically connected to the electrode layer (for example, the metal layer 120) above the thin film transistor 160 by the conductive via to transmit the electric signal to the pixels through the electrode layer. The flat layers 172, the interlayer insulators 174, and the electrode layers in the multilayer structure 170 are alternately arranged, so that the electrode layers may be electrically connected to the plurality of pixels without interfering each other. The metal layer 120 in the multilayer structure 170 act as the electrode layer that is electrically connected to the pixels by the pad layer 190 above, thereby transmitting the electric signal. In some embodiments, the multilayer structure 170 may further include a protection layer 176 above the pad layer 190 to protect and fix the position of the pad layer 190. The multilayer structure 170 may also include a conductive glass 178, such as indium tin oxide (ITO), covering the pad layer 190.

As shown in FIG. 3A and FIG. 3B, the body portion 122 of the metal layer 120 in the first region 130 may be patterned such that the body portion 122 has a gap D1 in its metal material. Correspondingly, the mesh portion 124 of the metal layer 120 in the second region 140 after patterning has a gap D2 in its metal material. The gap D1 of the body portion 122 is smaller than the gap D2 of the mesh portion 124, which makes the partial area of the first region 130 occupied by the body portion 122 larger than the partial area of the second region 140 occupied by the mesh portion 124. As a result, the first density of metal distribution of the first region 130 becomes higher than the second density of metal distribution of the second region 140.

Referring to FIG. 3A and FIG. 3B, in some embodiments, the display panel 100 may further include a metal layer 180 disposed below the metal layer 120. The metal layer 180 may also act as the electrode layer in the multilayer structure 170, so that the display panel 100 may control the pixels above the multilayer structure 170 by the metal layer 120 and the metal layer 180 to provide agile imaging.

The metal layer 180 is similar to the metal layer 120 shown in FIG. 2. Specifically, the metal layer 180 includes a body portion 182 at the center of the display panel 100 and a mesh portion 184 at the edge of the display panel 100 and adjacent to the body portion 182. The contour of the body portion 182 defines a third region of the display panel 100, while the contour of the mesh portion 184 defines a fourth region of the display panel 100. As shown in FIG. 3A and FIG. 3B, the body portion 182 has a gap D3 in its metal material. The mesh portion 184 has a gap D4 larger than the gap D3 in its metal material, so that the partial area of the third region occupied by the body portion 182 is larger than the partial area of the fourth region occupied by the mesh portion 184. As a result, the third density of metal distribution of the third region is higher than the fourth density of metal distribution of the fourth region. The mesh portion 184 may prevent the stress from concentrating at the edge of the display panel 100 and reduce the warpage possibility at the edge of the display panel 100.

In some embodiments, the first region 130 may be overlapped with the third region such that the area ratio of the first region 130 to the second region 140 is equal to the area ratio of the third region to the fourth region. In some other embodiments, the area ratio of the first region 130 to the second region 140 may be different from the area ratio of the third region to the fourth region. In other words, the area of the second region 140 defined by the mesh portion 124 may be different from that of the fourth region defined by the mesh portion 184. For example, the area of the second region 140 defined by the mesh portion 124 may be larger than that of the fourth region defined by the mesh portion 184. In some embodiments, when the second region 140 and the fourth region have an overlapped portion, the orthogonal projection of the mesh portion 124 onto the metal layer 180 may be at least partially overlapped with the mesh portion 184.

In summary, when the display panel 100 includes more than one metal layer (for example, the metal layer 120 and the metal layer 180), the metal layers with the mesh portion may collectively reduce the warpage possibility at the edge of the display panel 100 and improve the imaging performance of the display device 10.

Referring back to FIG. 1 and FIG. 2, in some embodiments, the body portion 122 of the metal layer 120 may directly contact the mesh portion 124 such that the body portion 122 and the mesh portion 124 form a stable structure. For example, the formation of the metal layer 120 may include plating a metal material that covers the entire display panel 100 and subsequentially patterning the metal material, so that the body portion 122 and the mesh portion 124 are integrally formed into one piece.

In some embodiments, the display panel 100 may be electrically connected to additional circuits by the mesh portion 124. For example, the mesh portion 124 of the display panel 100 may extend to the boundary between the display region 20 and the peripheral circuit region 30, which allows the display panel 100 to be electrically connected to the peripheral circuit 200 by the mesh portion 124. For another example, the plurality of the display panels 100 in the display device 10 may be electrically connected to each other by the mesh portion 124, so that no gap exists between the display panels 100. In this case, the distance between the pixels 110 in different display panels 100 may be equal to the distance between the pixels 110 in single display panel 100. Therefore, the display panels 100 in the display device 10 may form the display region 20 by frameless splicing, thereby improving the imaging performance of the display device 10.

In some embodiments illustrated in FIG. 1 and FIG. 2, the mesh portion 124 of the metal layer 120 may be distributed at two opposite sides of the display panel 100, which allows splicing the adjacent display panels 100 along the two sides by the mesh portion 124. In some other embodiments, the mesh portion 124 of the metal layer 120 may be distributed at less or more than two sides of the display panel 100, so that the adjacent display panels 100 are directly spliced together by the mesh portion 124.

According to another embodiment of the present disclosure, FIG. 4 illustrates a top view of a display panel 100'. The display panel 100' includes a plurality of pixels 110' and a metal layer 120' below the pixels 110'. The metal layer 120' includes a body portion 122' at the center of the display panel 100' and a mesh portion 124' at the edge of the display panel 100'. The first pixels 110a' of the pixels 110' are disposed in the first region 130' defined by the body portion 122', while the second pixels 110b' of the pixels 110' are disposed in the second region 140' defined by the mesh portion 124'. As shown in FIG. 4, the mesh portion 124' are distributed at four sides of the display panel 100, so that the second region 140' surrounds the first region 130'. Therefore, when splicing a plurality of the display panels 100', the display panels 100' on the left side/right side and the upper side/lower side may be directly spliced together by the mesh portion 124'.

Figure 5B:
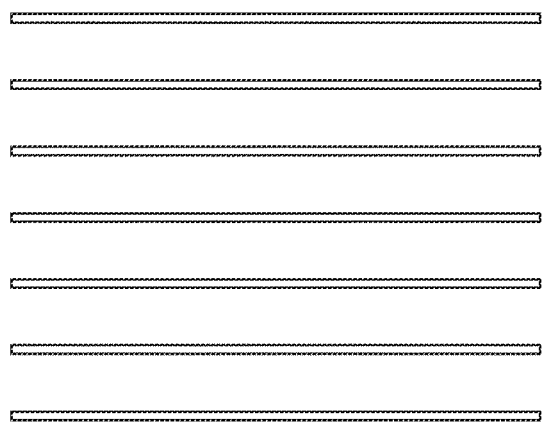
FIG. 5A to FIG. 5D illustrate top views of mesh portions of metal layers according to some embodiments of the present disclosure.
Figure 5D:
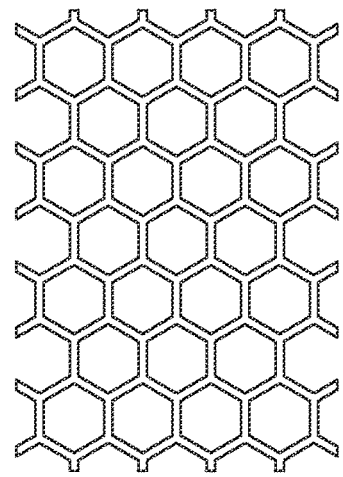
Figure 5A:
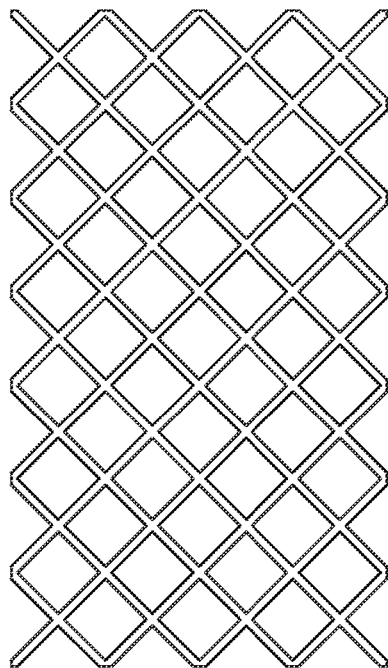
Figure 5C:
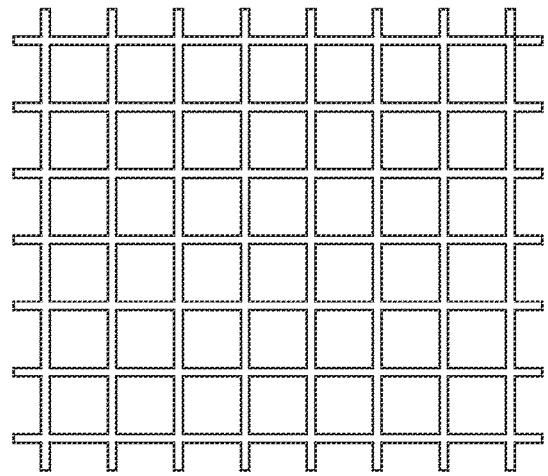

The mesh portion 124 of the metal layer 120 may have a shape different from that of illustrated in FIG. 2, and the mesh portion 124 with an altered shape may also effectively reduce the warpage possibility of the display panel 100. According to some embodiments of the present disclosure, FIG. 5A to FIG. 5D respectively illustrates a top view of a mesh portion with various shapes. Specifically, the mesh portion illustrated in FIG. 5A has a metal material alternately arranged in a first direction and a second direction different from the first direction such that the mesh portion has a diamond shape. The mesh portion illustrated in FIG. 5B has a metal material arranged in parallel along single direction such that the mesh portion has a linear shape. The mesh portion illustrated in FIG. 5C has a metal material alternately arranged in a first direction and a second direction perpendicular to the first direction such that the mesh portion has a square shape. The mesh portion illustrated in FIG. 5D has a metal material alternately arranged in a first direction, a second direction, and a third direction; the angles between either two of the three directions are the same such that the mesh portion has a honeycomb shape. In some embodiments, the mesh portion 124 of the metal layer 120 may have a combination of different shapes distributed in different portions of the mesh portion 124. For example, the mesh portion 124 of one metal layer 120 may have a linear shape and a square shape at the same time.

In some embodiments, the linewidth and the line spacing of the mesh portion 124 of the metal layer 120 may be suitable to reduce the warpage possibility of the display panel 100 without significantly increasing the impedance of the metal layer 120. For example, the linewidth of the mesh portion 124 may be in a range of 2 μm to 30 μm. If the linewidth of the mesh portion 124 is smaller than 2 μm, the impedance of the mesh portion 124 may be significantly increased, thereby impacting the signal transmission in the metal layer 120. If the linewidth of the mesh portion 124 is larger than 30 µm, the stress applied by the metal layer 120 to the substrate may be too uneven to effectively reduce the warpage possibility of the display panel 100.

In some embodiments, the line spacing of the mesh portion 124 may be smaller than or equal to half of the distance between two of the pixels 110. For example, the line spacing of the mesh portion 124 may be in a range of 3 µm to 250 µm. If the line spacing of the mesh portion 124 is smaller than 3 µm, the density of metal distribution of the second region 140 may be too high to effectively reduce the warpage possibility of the display panel 100. If the line spacing of the mesh portion 124 is larger than 250 µm, the metal material of the mesh portion 124 may be too sparse so that it is hard for the mesh portion 124 to electrically connect the multiple pixels 110 above. In some other embodiments, the line spacing of the mesh portion 124 may be in a range of 100 µm to 250 µm to form the second region 140 having the low density of metal distribution.

According to the above-mentioned embodiments, the display panel of the present disclosure includes the patterned metal layer below the pixels, where the contour of the body portion at the center of the display panel defines the first region, and the contour of the mesh portion at the edge of the display panel defines the second region. Since the density of metal distribution of the first region is higher than that of the second region, the mesh portion in the second region may reduce the warpage possibility at the edge of the display panel and improve the imaging performance of the display panel. In addition, the area of the second region having the mesh portion is 20% to 40% of the area of the display panel. This allows the mesh portion to effectively reduce the warpage possibility of the display panel, while the body portion may maintain the low impedance of the metal layer display panel for the electric signal transmission.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display panel, comprising:
    pixels; and
    a first metal layer below the pixels, wherein the first metal layer comprises:
        a first body portion at a center of the display panel, wherein a contour of the first body portion defines a first region of the display panel, first pixels of the pixels are disposed in the first region and electrically connected to the first body portion; and
        a first mesh portion at an edge of the display panel and adjacent to the first body portion, wherein a contour of the first mesh portion defines a second region of the display panel, second pixels of the pixels are disposed in the second region and electrically connected to the first mesh portion,
    wherein the first mesh portion and the first body portion are electrically connected to each other, a first density of metal distribution of the first region is higher than a second density of metal distribution of the second region, and an area of the second region is 20% to 40% of an area of the display panel.

2. The display panel of claim 1, wherein the first density of metal distribution of the first region is higher than 85%.

3. The display panel of claim 1, wherein the second density of metal distribution of the second region is in a range of 50% to 85%.

4. The display panel of claim 1, wherein a total density of metal distribution of the first metal layer is higher than or equal to 50%.

5. The display panel of claim 1, wherein an area of the first region is 60% to 80% of the area of the display panel.

6. The display panel of claim 1, wherein an electric potential of the first region is same as that of the second region.

7. The display panel of claim 1, wherein the first body portion directly contacts the first mesh portion.

8. The display panel of claim 1, wherein the first body portion and the first mesh portion are integrally formed into one piece.

9. The display panel of claim 1, wherein a linewidth of the first mesh portion is in a range of 2 µm to 30 µm.

10. The display panel of claim 1, wherein a line spacing of the first mesh portion is smaller than or equal to half of a distance between two of the pixels.

11. The display panel of claim 1, wherein a line spacing of the first mesh portion is in a range of 3 µm to 250 µm.

12. The display panel of claim 1, wherein the first mesh portion has a linear shape, a diamond shape, a square shape, or a honeycomb shape.

13. The display panel of claim 1, wherein the first mesh portion has a combination of different shapes distributed in different portions of the first mesh portion.

14. The display panel of claim 1, further comprising:
    a second metal layer below the first metal layer, wherein the second metal layer comprises:
        a second body portion at the center of the display panel, wherein a contour of the second body portion defines a third region of the display panel; and
        a second mesh portion at the edge of the display panel and adjacent to the second body portion, wherein a contour of the second mesh portion defines a fourth region of the display panel, a third density of metal distribution of the third region is higher than a fourth density of metal distribution of the fourth region.

15. The display panel of claim 14, wherein an orthogonal projection of the first mesh portion onto the second metal layer is at least partially overlapped with the second mesh portion.

16. The display panel of claim 14, wherein an area ratio of the first region to the second region is equal to an area ratio of the third region to the fourth region.

17. The display panel of claim 14, wherein an area of the fourth region is different from that of the second region.

18. A display device, comprising:
    a plurality of display panels in a display region, wherein each of the plurality of display panels comprises:
        a thin film transistor;
        an electrode layer above and electrically connected to the thin film transistor,
        wherein a body portion of the electrode layer is at a center of the display panel, a mesh portion of the electrode layer is at an edge of the display panel and adjacent to the body portion, a contour of the body portion defines a first region of the display panel, and a contour of the mesh portion defines a second region of the display panel, wherein a partial area of the first region occupied by the body portion is larger than a partial area of the second region occupied by the mesh portion, and an area of the second region is 20% to 40% of an area of the display panel; and a pad layer above and electrically connected to the electrode layer, wherein the plurality of display panels are spliced together by the mesh portion of each of the plurality of display panels to form the display region.

19. The display device of claim 18, wherein the mesh portion of one of the display panels is distributed at two opposite sides of the display panel.

20. The display device of claim 18, further comprising:
a peripheral circuit in a peripheral circuit region adjacent to the display region, wherein the peripheral circuit is electrically connected to the display panels by the mesh portion of one of the display panels.

* * * * *